United States Patent [19]
Plauger

[11] 3,947,304
[45] Mar. 30, 1976

[54] ETCHING OF GROUP III-V SEMICONDUCTORS

[75] Inventor: Lillian Rankel Plauger, Piscataway, N.J.

[73] Assignee: Bell Telephone Laboratories, Incorporated, Murray Hill, N.J.

[22] Filed: Aug. 15, 1972

[21] Appl. No.: 280,784

[52] U.S. Cl. .................. 156/13; 29/580; 156/17; 252/79.5; 427/88
[51] Int. Cl.$^2$ .......................................... H01L 7/50
[58] Field of Search ............. 156/3, 8, 11, 13, 17; 252/79.5; 317/235; 29/583, 580, 578; 427/88, 89

[56] References Cited
UNITED STATES PATENTS 3,674,580   7/1972   Erdman ........................ 156/17 X
3,716,429   2/1973   Sebastian et al. .................. 156/17

Primary Examiner—William A. Powell
Attorney, Agent, or Firm—G. S. Indig; A. N. Friedman

[57] ABSTRACT

Group III-V compound semiconductor devices with attached gold conductor areas are etched using a basic ferricyanide etchant. The etchant is an aqueous solution containing ferricyanide ions in a concentration from 0.8 molar to 1.2 molar and sodium or potassium hydroxide in a concentration from 0.3 molar to 1.5 molar. This etchant rapidly removes the semiconductor material leaving smooth surfaces, while leaving the gold conductors and areas protected by oxide layers essentially intact. The use of titanium layers as etching masks, deposited for example by evaporating or sputtering through a removable mask, is also disclosed.

12 Claims, 6 Drawing Figures

ETCHING OF GROUP III-V SEMICONDUCTORS

BACKGROUND OF THE INVENTION

1. Field of the Invention

The invention concerns the processing of Group III-V compound semiconductor devices by etching.

2. Description of the Prior Art

Techniques for the processing of Group III-V semiconductor materials are currently under intensive development. One area of development is the provision of etchants which will not destroy the gold contact areas, which are present on the semiconductor wafer during the later processing steps in device fabrication, while rapidly and smoothly etching the semiconductor material. Etchants in general use in Group III-V compound semiconductor processing technology are less than optimum for this use in one or another respect. For instance, aqua regia or bromine-in-methanol, which etch Group III-V materials relatively rapidly, also attack the gold contacts or areas of the wafer protected by oxide layers. Other etchants compatible with the gold contacts, such as $H_2SO_4:H_2O_2$, etch the semiconductor material at a rate which is too slow for many purposes especially in the widely used but difficultly etched metal-(111) direction (i.e. the (111) face containing the Group III constituent).

An etchant, which has been used in the investigation of dislocations in bare wafers of the Group III-V compound semiconductors by producing etch pits on (111) faces, is a solution containing approximately 0.25 molar $K_3Fe(CN)_6$ and approximately 2 molar KOH (*Soviet Physical: Solid State*, Vol. 8 [1967] page 1976). Such etch pits generally become deeper as etching proceeds. A similar composition has been used simultaneously with mechanical polishing to produce smooth surfaces on wafers of the subject materials (German Patent No. 1,227,307 issued Oct. 20, 1966, to Siemens and Halske A.-G.). However, such simultaneously processing cannot be used when contacts or passivation layers are present on the wafer surfaces to be etched.

SUMMARY OF THE INVENTION

An etchant has been developed which relatively rapidly removes material from Group III-V compound semiconductor bodies, leaving smooth surfaces on the technologically important crystal faces (e.g. (111), (110) and (100)). This etchant does not significantly degrade gold contact areas or areas passivated or masked by oxide and titanium layers. The etchant is a basic ferricyanide solution containing the ferricyanide ion in a concentration from 0.8 molar to 1.2 molar (i.e. 0.8 to 1.2 times Avogadro's number of ferricyanide ions per liter of solution) and KOH or NaOH in a concentration from 0.3 molar to 1.5 molar. This is a higher ferricyanide concentration and a lower hydroxide concentration than the metallographic etchants referred to above. This etchant is especially useful during later processing stages of device fabrication. During these later stages many classes of devices, such as those using beam lead technology, contain gold conductor and contact areas and other areas masked or passivated by oxide layers. It has also been found that layers of titanium can be used to protect areas, otherwise exposed, from attack by this etchant. Titanium is a particularly convenient etch mask, since it can be deposited by such methods as evaporation or sputtering through a removable mask (shadow mask). Sputtering can be accomplished with the semiconductor wafer at a relatively low temperature, which can be important in suppressing any unwanted diffusion of some of the relatively mobile dopants in the Group III-V materials.

DETAILED DESCRIPTION OF THE INVENTION

The Etchant

Figure 1A:
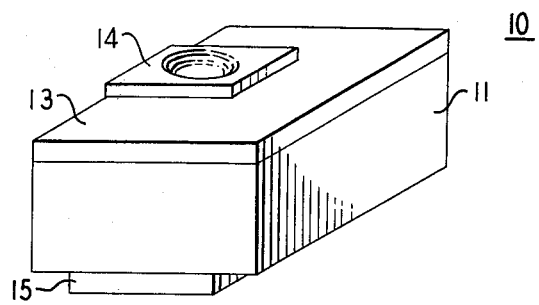
FIG. 1A is a perspective view of an exemplary semiconductor device at a stage prior to final processing.

The disclosed etchant is an aqueous solution containing a ferricyanide compound such as $Na_3Fe(CN)_6$ or $K_3Fe(CN)_6$ with the ferricyanide ions in a concentration range from 0.8 molar to 1.2 molar. Solutions less than 0.8 molar tend to produce etch pits which become deeper as etching progresses and are thus generally unsuitable for the contemplated uses. Solutions greater than 1.2 molar are difficult to obtain because of the solubility limits of the ferricyanide compounds. A preferred concentration range for the processing of gallium phosphide and gallium arsenide and their alloys (gallium arsenide phosphide) is from 0.9 molar to 1.2 molar.

The surfaces produced by the subject etchants on the technologically important crystal faces of, for example, GaP and GaAs are smooth. The surface quality varies from a high polish on the (100) and (110) faces to slightly irregular on the usual difficultly etched gallium-(111) face. The irregularities observed are not such as to materially degrade device performance. Other known Group III-V semiconductors, such as InSb, InP, InAs, GaSb, AlP, AlAs, AlSb and their ternary alloys, behave similarly, with the metal-(111) face being the most difficult to etch of the major faces. Here the metal-(111) face connotes the crystal face containing atoms of the Group III constituent. The addition of minor amounts of known dopants, incorporated to impart electrical conductivity of the desired type, does not significantly affect the character of the surface produced by the etchant. Dopants frequently encountered are the n-type dopants, S, Se, and Te, the p-type dopants, Zn, Cd and Hg, and the amphoteric dopants, C, Si, Ge, Sn and Pb. Others are also known. When used, such dopants are normally incorporated in an amount less than one percent by weight of the semiconductor material.

The etchant also contains sodium hydroxide or potassium hydroxide in a concentration range from 0.3 molar to 1.5 molar. Solutions less than 0.3 molar, in the hydroxide constituent, tend to be too slow for the contemplated uses; whereas, solutions greater than 1.5 molar tend to yield poorer surfaces and attack oxide and titanium layers more rapidly. For GaP, GaAs and their alloys, solutions from approximately 0.4 to 0.7 molar in the hydroxide constituent are preferred.

The temperature range which has been found to be preferable for the operation of the disclosed etchant is from 60°C to 95°C. At temperatures less than 60°C, the removal of material from the semiconductor surface tends to be too slow for the contemplated uses; whereas, at temperatures above 95°C, the removal of material tends to be too rapid to maintain adequate control over the etching process. A temperature range which has been found to be preferred for the etching of gallium phosphide and gallium arsenide materials is from 75°C to 85°C. Under these conditions, gallium phosphide is removed from the gallium - (III) face at a rate between 100 and 250 micrometers per hour; while gallium arsenide is removed at a rate approximately a factor of two more slowly by an etchant which is 1 molar in $K_3Fe(CN)_6$ and 0.5 molar in KOH. The (100) and (110) faces are more rapidly etched.

Exemplary Uses

FIG. 1 shows an exemplary semiconductor device 10, at an intermediate processing stage, consisting of a wafer 11 of a Group III-V semiconductor material. The upper surface of the wafer 11 is covered, except for a window area 12, by a layer 13 of an oxide material—such as $SiO_2$. Superposed upon the layer 13 and contacting the wafer 11 through the window area 12 is a gold-containing contact area 14. A portion of the lower surface of the wafer 11 is masked by a layer 15 of titanium. The titanium area has been deposited by evaporation or sputtering through a shadow mask. Titanium layer areas so used for masking are preferably from 500 Angstroms to 5000 Angstroms thick. Layers thinner than 500 Angstroms generally give insufficient protection while layers thicker than 5000 Angstroms are unnecessarily thick, the extra thickness affording no further protection while requiring additional deposition time. Layers from 1000 Angstroms to 3000 Angstroms thick are optimum for most purposes. The deposition of these layer areas through a shadow mask eliminates the photoresist and etching steps which would be required if the whole surface were first coated and then the protected areas defined by photolithographic processing.

Figure 1B:
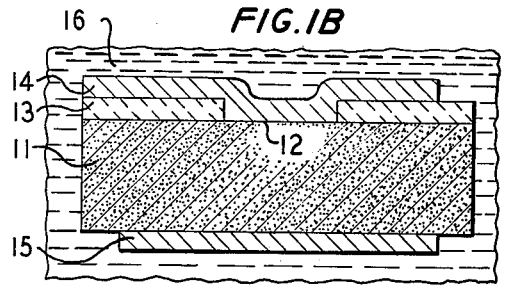
FIG. 1B is an elevational view in section of the device of FIG. 1A immersed in an etchant.

FIG. 1B shows this exemplary device immersed in an etchant 16 of the disclosed composition.

Figure 1C:
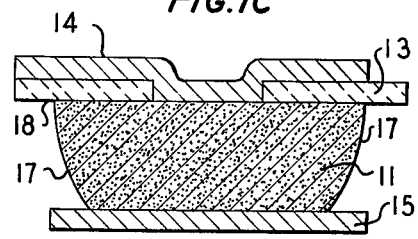
FIG. 1C is an elevational view in section of the device of FIG. 1B after etching with the disclosed etchant.

FIG. 1C shows this device after the etching has proceeded sufficiently long to reduce the sides of the wafer 11 to the desired shape 17 (e.g., to optimize the light output of electroluminescent diodes) and to expose the end 18 of the gold contact 14 for beam lead bonding.

Figure 2A:
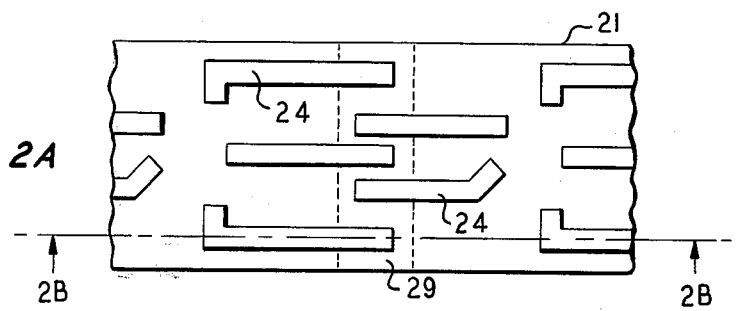
FIG. 2A is a plan view of an exemplary semiconductor device at a stage prior to final processing.
Figure 2B:
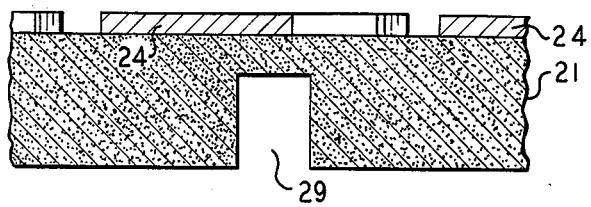
FIG. 2B is an elevational view in section of the device of FIG. 1A.

The use of the disclosed etchants in the separation etching of beam lead devices is illustrated in FIG. 2. FIG. 2A shows a portion 21 of a large wafer containing an array of prospective beam lead devices with affixed gold contact areas 24. A saw cut 29 has been made partially through the wafer 21 from the uncontacted reverse side.

Figure 2C:
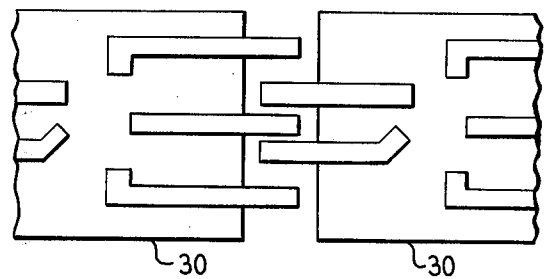
FIG. 2C is a plan view of portions of two devices produced from the device of FIG. 2A by the disclosed etching procedure.

FIG. 2C shows the separated devices 30 after etching in which the etchant has removed the remaining semiconductor material above the saw cut 29 without significant degradation of the gold contacts or oxide protected areas.

What is claimed is:

1. Method for the production of a semiconductor device comprising etching a body consisting of at least a semiconductor body and a first metallic body affixed thereto, in which at least 99 percent by weight of the semiconductor body consists of a Group III-V compound semiconductor and in which the first metallic body includes gold, by contacting at least a portion of the semiconductor body and at least a portion of the gold with an etchant characterized in that the etchant consists essentially of an aqueous solution containing ferricyanide ions in a concentration from 0.8 molar to 1.2 molar and at least one hydroxide of the group consisting of sodium hydroxide and potassium hydroxide in a total concentration from 0.3 molar to 1.5 molar.

2. Method of claim 1 in which the ferricyanide ions are derived from a ferricyanide compound which compound is at least one member selected from the group consisting of $K_3Fe(CN)_6$ and $Na_3Fe(CN)_6$.

3. Method of claim 2 in which the ferricyanide compound is $K_3Fe(CN)_6$.

4. Method of claim 2 in which the Group III-V compound semiconductor is at least one member of the group consisting of GaP and GaAs.

5. Method of claim 4 in which the etching takes place at a temperature from 60°C to 95°C.

6. Method of claim 5 in which the etching takes place at a temperature from 75°C to 85°C.

7. Method of claim 4 in which the ferricyanide ions are present in a concentration from 0.9 molar to 1.2 molar and the hydroxide is present in a concentration from 0.4 molar to 0.7 molar.

8. Method of claim 1 in which a second metallic body is affixed to the semiconductor body, which second metallic body includes a layer of titanium metal between 500 Angstroms and 5000 Angstroms thick.

9. Method of claim 8 in which the second metallic body is from 1000 Angstroms to 3000 Angstroms thick.

10. Method of claim 8 in which the second metallic body is deposited onto the semiconductor portion through a removable mask.

11. Method of claim 8 in which the second metallic body is deposited by sputtering.

12. Method for the production of a semiconductor device comprising etching a body consisting of at least a semiconductor body in which at least 99 percent by weight of the semiconductor body consists of a Group III-V compound semiconductor, by contacting at least a portion of the semiconductor body with an etchant characterized in that the etchant consists essentially of an aqueous solution containing ferricyanide ions in a concentration from 0.8 molar to 1.2 molar and at least one hydroxide of the group consisting of sodium hydroxide and potassium hydroxide in a total concentration from 0.3 molar to 1.5 molar.

* * * * *